(12) United States Patent
Lima

(10) Patent No.: US 7,420,820 B1
(45) Date of Patent: Sep. 2, 2008

(54) POSITIONABLE HANDLE FOR INSERTION AND EXTRACTION

(75) Inventor: David J. Lima, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 524 days.

(21) Appl. No.: 11/260,838

(22) Filed: Oct. 27, 2005

(51) Int. Cl.
H05K 7/14 (2006.01)

(52) U.S. Cl. .................. 361/798; 361/754; 361/732; 361/747; 361/726; 361/759; 312/223.2

(58) Field of Classification Search ................ 361/726, 361/732, 740, 747, 759, 754, 798, 801; 312/223.2, 312/223.3
See application file for complete search history.

(56) References Cited

U.S. PATENT DOCUMENTS

| | | | |
|---|---|---|---|
| 6,301,123 B1 * | 10/2001 | Nealis et al. ................ 361/798 |
| 6,674,651 B2 * | 1/2004 | Momiyama et al. ......... 361/796 |
| 6,801,434 B2 * | 10/2004 | Gallarelli et al. ............ 361/747 |
| 6,904,655 B1 | 6/2005 | Lima et al. |
| 6,975,519 B2 * | 12/2005 | Siahpolo et al. ............. 361/798 |
| 6,992,900 B1 * | 1/2006 | Suzue et al. ................ 361/801 |

\* cited by examiner

*Primary Examiner*—Tuan Dinh
*Assistant Examiner*—Dameon E Levi
(74) *Attorney, Agent, or Firm*—Shumaker & Sieffert P.A

(57) ABSTRACT

A device for insertion and extraction of printed circuit boards or other components from a device or system such as a network router includes a positionable handle. The handle adjusts in a manner similar to a handle on a c-clamp, and may be repositioned relative to the centerline of a driveshaft of the device. Additionally, the handle may include internal detents that define selectable handle positions. Various handle positions may allow an operator to utilize limited available space and increase the mechanical advantage of the handle.

17 Claims, 6 Drawing Sheets

POSITIONABLE HANDLE FOR INSERTION AND EXTRACTION

TECHNICAL FIELD

The invention relates generally to coupling components and, more specifically, to the coupling of printed circuit boards and other components.

BACKGROUND

Various electrical devices and computing systems, such as network routers, utilize printed circuit boards or other removable modules. Printed circuit boards generally have one or more connecters that couple with a socket or receptacle. The connectors often include a plurality of discrete elements, such as pins or tabs. Similarly, the socket or receptacle will include a corresponding number of recesses to receive each of the pins or tabs.

Properly inserting a printed circuit board into an electrical device can often be a tedious and difficult task. Each individual pin or tab, for example, requires a certain amount of force to properly seat the printed circuit board into the socket. The total force required to seat the printed circuit board or other module includes the cumulative sum of the forces required to seat each individual pin or tab. Thus, as the number of pins or tabs increase, the force required to seat the printed circuit board likewise increases. Similarly, the extraction of printed circuit boards or other devices from such systems often requires a relatively large amount of force, typically about 75-80% of the force required for insertion.

To assist in the insertion and extraction of circuit boards and other modules, some systems provide various mechanical aids. Conventional mechanical aids include, for example, levers or threaded members, such as alignment screws. The threaded members are typically attached to the circuit board and align with a corresponding threaded connector coupled with the system.

In general, larger mechanical aids may provide a greater mechanical advantage, facilitating easier insertion and extraction of circuit boards or other modules. However, many devices require a plurality of printed circuit boards or other removable modules. For example, a network router may include ten or more removable circuit boards. In order to conserve space, such devices are generally designed to mount printed circuit boards or other removable modules close together. Accordingly, the space surrounding such modules may restrict the size of the mechanical aids and, therefore, the mechanical advantage they provide.

In other words, problems associated with these mechanical aids include the practical limits of the amount of force they can apply, the difficulty in manipulating these aides, and placing relatively large aides in small spaces. The same mechanical aids are often used for both insertion and extraction and may have the same problems and drawbacks in either case.

SUMMARY

In general, the invention relates to a device for assisting in the insertion and extraction of printed circuit boards or other components from a device or system such as a network router. The insertion and extraction device includes a positionable handle to aid in the insertion and extraction of the printed circuit board or other removable module. The positionable handle may allow a user to select a position for the handle that provides adequate mechanical advantage for insertion or extraction of the module, while still enabling a user to manipulate the handle within the available space.

The handle may adjust in a manner similar to a handle of a c-clamp. The handle may be repositioned relative to the centerline of a driveshaft of the device, but is operably coupled to the driveshaft as the handle rotates in unison with the driveshaft about the centerline of the driveshaft. The handle may include internal detents that engage the driveshaft and define selectable handle positions. For example, the handle may include three detents: one that centers the handle on the centerline of the driveshaft and one on each end of the handle. The user may select a position for rotation of the driveshaft and handle and return the handle to an original position when rotation is completed. In some cases, the user may select different positions throughout rotation as the available space or needed mechanical advantage changes.

In one embodiment, the invention is directed to system comprising a removable electrical component, a fixed receptacle to receive the removable electrical component, and an insertion and extraction device coupled to the removable electrical component. The insertion and extraction device includes a rotatable driveshaft that interacts with the receptacle when rotated for insertion or extraction of the removable electrical component. The insertion and extraction device also includes a handle sized to fit over a proximate end of the driveshaft, wherein the handle is coupled to the driveshaft such that as the driveshaft rotates about its centerline, the handle also rotates about the centerline of the driveshaft, and a slider mechanism that allows the handle to slide along a line substantially perpendicular to the centerline of the driveshaft.

In another embodiment, the invention is directed to a device for inserting and extracting a removable electrical component, the device comprising a rotatable driveshaft, a handle sized to fit over a proximate end of the driveshaft, and a slider mechanism. The rotatable driveshaft interacts with a receptacle of a fixed component when rotated for insertion and extraction of the removable electrical component to and from the receptacle. The handle is coupled to the driveshaft such that as the driveshaft rotates about its centerline, the handle also rotates about the centerline of the driveshaft. The slider mechanism allows the handle to slide along a line substantially perpendicular to the centerline of the driveshaft.

In another embodiment, the invention is directed to a method comprising inserting a distal end of a driveshaft of an insertion and extraction device into a fixed receptacle of a system, sliding a handle of the insertion and extraction device along a line that is substantially perpendicular to a centerline of the driveshaft to select a position of the handle, and rotating the handle and the driveshaft with the handle in the selected position to insert a removable electrical component coupled to the insertion and extraction device into the receptacle. The handle is sized to fit over the proximate end of the driveshaft, and the handle is coupled to the driveshaft such that as the driveshaft rotates about its centerline, the handle also rotates about the centerline of the driveshaft.

Embodiments of the invention may provide one or more advantages. For example, embodiments of the invention may provide an insertion and extraction device that includes a handle that may be operated within a limited space with significant leverage. In some embodiments, the handle may be repositioned reliably by virtue of internal detents which receive a driveshaft of an insertion and extraction device. The detents may prevent the inadvertent repositioning of the handle, e.g., due to vibration or gravity. In this manner, embodiments of the invention may provide selectable and reliable positioning of a handle on an insertion and extraction device. Because embodiments of the invention are adaptable to various coupling mechanisms, embodiments of the invention may also provide reverse compatibility with current receptacles for insertion and extraction devices.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
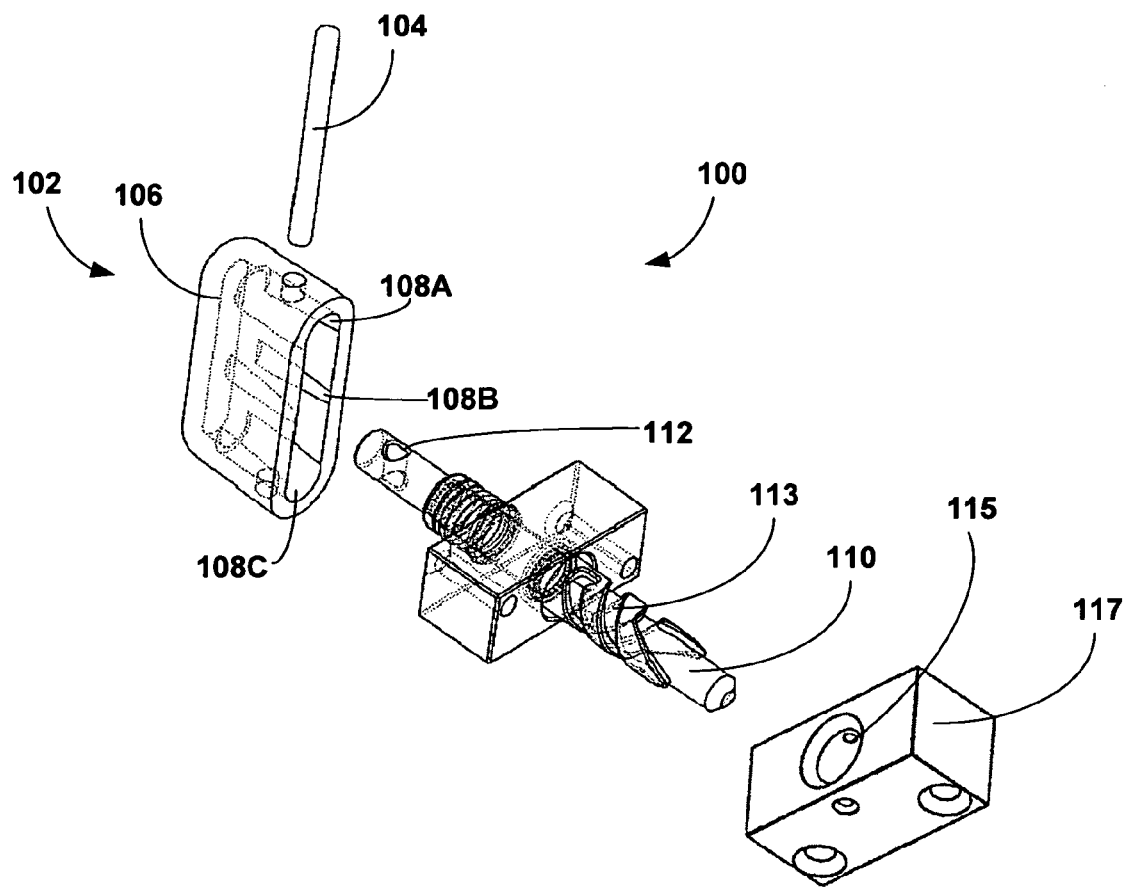
FIGS. 1A-1D are perspective and side-view diagram illustrating an example insertion and extraction device with a positionable handle.
Figure 1B:
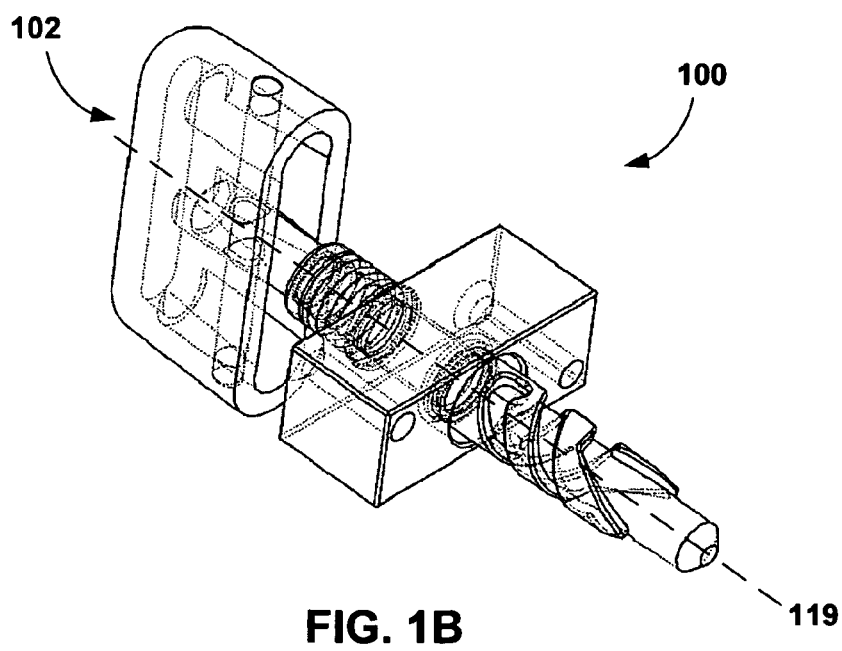
Figure 1C:
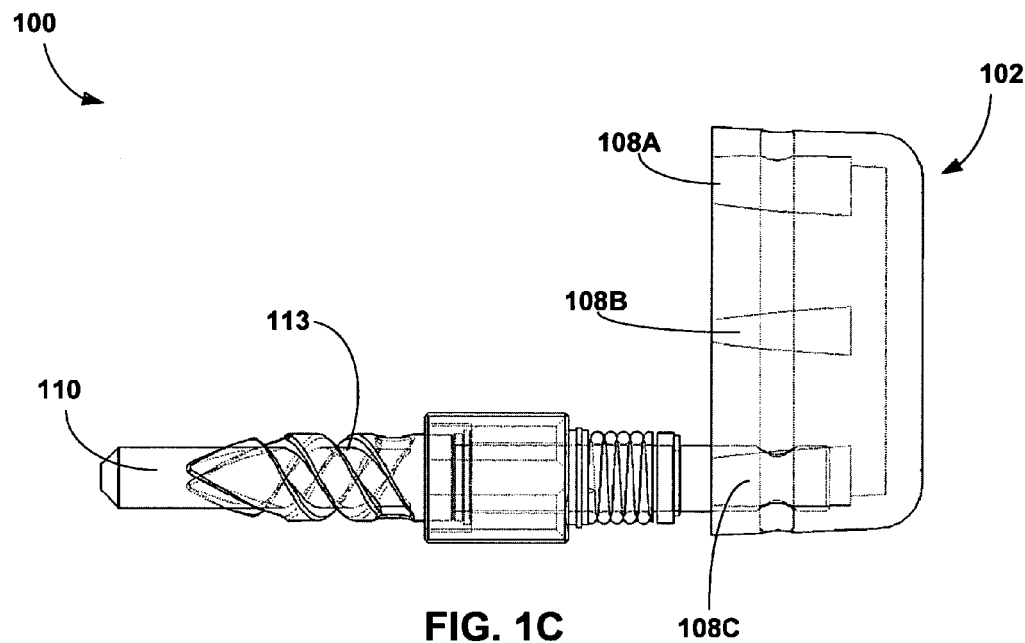
Figure 1D:
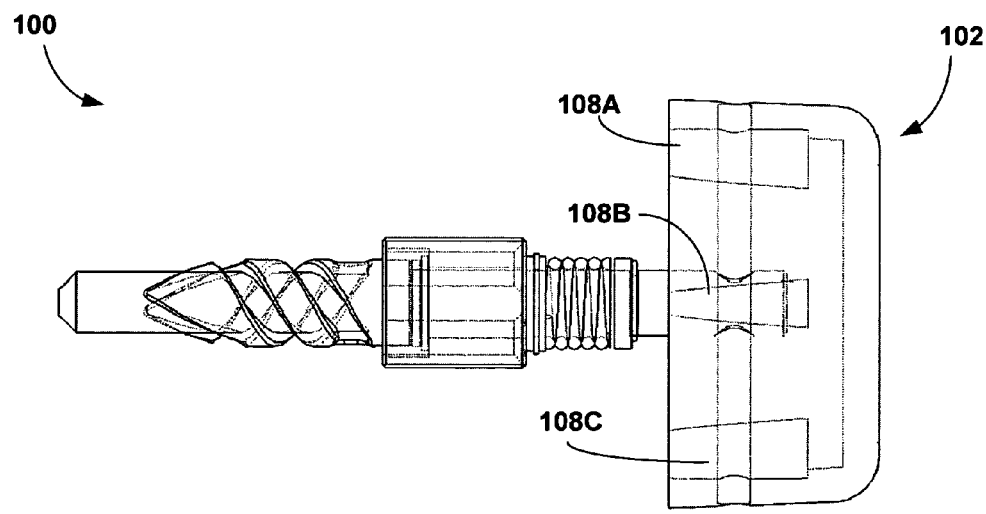

FIGS. 1A-1D (collectively "FIG. 1") are perspective and side-view diagrams illustrating an insertion and extraction device 100, which includes a handle 102. Specifically, FIG. 1A illustrates an exploded perspective view of handle 102 on insertion and extraction device 100. FIG. 1B is a perspective view of insertion and extraction device 100. FIGS. 1C and 1D are side views of insertion and extraction device 100 with a driveshaft 110 centered in detents 108C and 108B respectively.

Insertion and extraction device 100 may be coupled to an electrical component (not shown in FIGS. 1A-1D), such as a printed circuit board, of a system (not shown in FIGS. 1A-1D), such as network router or other computing device. Insertion and extraction device 100 may be used to insert the component into a fixed receptacle of the system, e.g., a bay or slot.

Insertion and extraction device 100 includes driveshaft 110. Driveshaft 110 fits into a female connector 117, a receiving mechanism included as part of the receptacle of the system. For example, a receptacle of the system may include a slot sized to hold the electrical component as well as one or more female connectors 117 to receive driveshafts 110.

As shown in FIG. 1, driveshaft 110 includes a helical groove 113 at its distal end. Driveshaft 110 forms helical groove 113. Female connector 117 includes a pin 115 or other assembly that fits within helical groove 113 of driveshaft 110. When driveshaft 110 is rotated, helical groove 113 may interact with pin 115 to move the component in or out female connector 117. For example, a helical drive system including a driveshaft with a helical groove is described in U.S. Pat. No. 6,904,655 to Lima et al., which is hereby incorporated by reference in its entirety.

Depending on the direction of rotation, rotating driveshaft 110 within female connector 117 either pulls insertion and extraction device 100 into female connector 117, coupling insertion and extraction device 100 to female connector 117, or pushes insertion and extraction device 100 from female connector 117, releasing insertion and extraction device 100 from female connector 117. While driveshaft 110 uses a helical groove to interact with female connector 117, other embodiments may use other coupling techniques. For example, in other embodiments, driveshaft 110 may be a simple screw or other rotatable coupling apparatus that combines with a receiving mechanism to attach an electrical component to a system.

Handle 102 is sized to fit over a proximal end of driveshaft 110. Handle 102 includes a pin 104 and a grip component 106. Pin 104 may be press-fit, glued or otherwise coupled to grip component 106 in order to form handle 102. Pin 104 fits loosely within hole 112 formed by driveshaft 110 at its proximate end in order to constrain handle 102 to driveshaft 110. The combination of pin 104 with hole 112 creates a slider mechanism for handle 102 on driveshaft 110. Because pin 104 fits loosely within hole 112, the position of handle 102 may be adjusted relative to a centerline 119 of driveshaft 110. Pin 104 and driveshaft 110 may be formed of metal, polyvinylchloride, plastic, or any of a variety of relatively resilient and/or rigid materials.

Grip component 106 of handle 102 forms detents 108A-108C (collectively "detents 108"). Detents 108 may facilitate stable positioning of handle 102 on driveshaft 110. Detents 108 are each capable of firmly holding handle 102 in a secure position on driveshaft 110. However, an operator may slide handle 102 to a selectable position defined by one of detents 108. Each detent 108 provides for a single selectable position. Because grip component 106 includes thee detents 108, handle 102 has three selectable positions relative to driveshaft 110. Grip components according to the invention may include any number of detents.

Grip component 106 may be made from an elastic material and/or may be configured, e.g., with respect to thickness, such that it is elastic. For example, grip component 106 may be a polyvinylchloride or plastic component. The material and configuration for grip component 106 may be selected to hold driveshaft 110 securely within detents 108, but also allow an operator to select the position of handle 102 by sliding it between two of detents 108.

FIG. 1C shows detent 108C over driveshaft 110. The selectable position provided by detent 108C gives an operator the maximum available leverage to deliver a torque to driveshaft 110. Likewise, the selectable position provided by detent 108A gives an operator the maximum available leverage to deliver a torque to driveshaft 110, but provides for a different position of handle 102 relative to driveshaft 110. FIG. 1D shows detent 108B over driveshaft 110. The selectable position provided by detent 108B centers handle 102 on driveshaft 110, but does not provide as much leverage as the positions defined by detent 108A and 108C. The different selectable positions of handle 102 may allow an operator select a position that allows the operator to most easily turn driveshaft 110 within a confined space.

Insertion and extraction device 100 may be coupled, for example, to a removable printed circuit board or other removable module. The removable printed circuit board or other removable module may be mounted to a system in a manner that does not provide substantial space to use insertion and extraction device 100. The physical constraints may be such that an operator may need to change the position of handle 102 during the process of rotating driveshaft 110. In other instances, changing the position of handle 102 may simply result in a more comfortable or convenient position for an operator.

Figure 2:
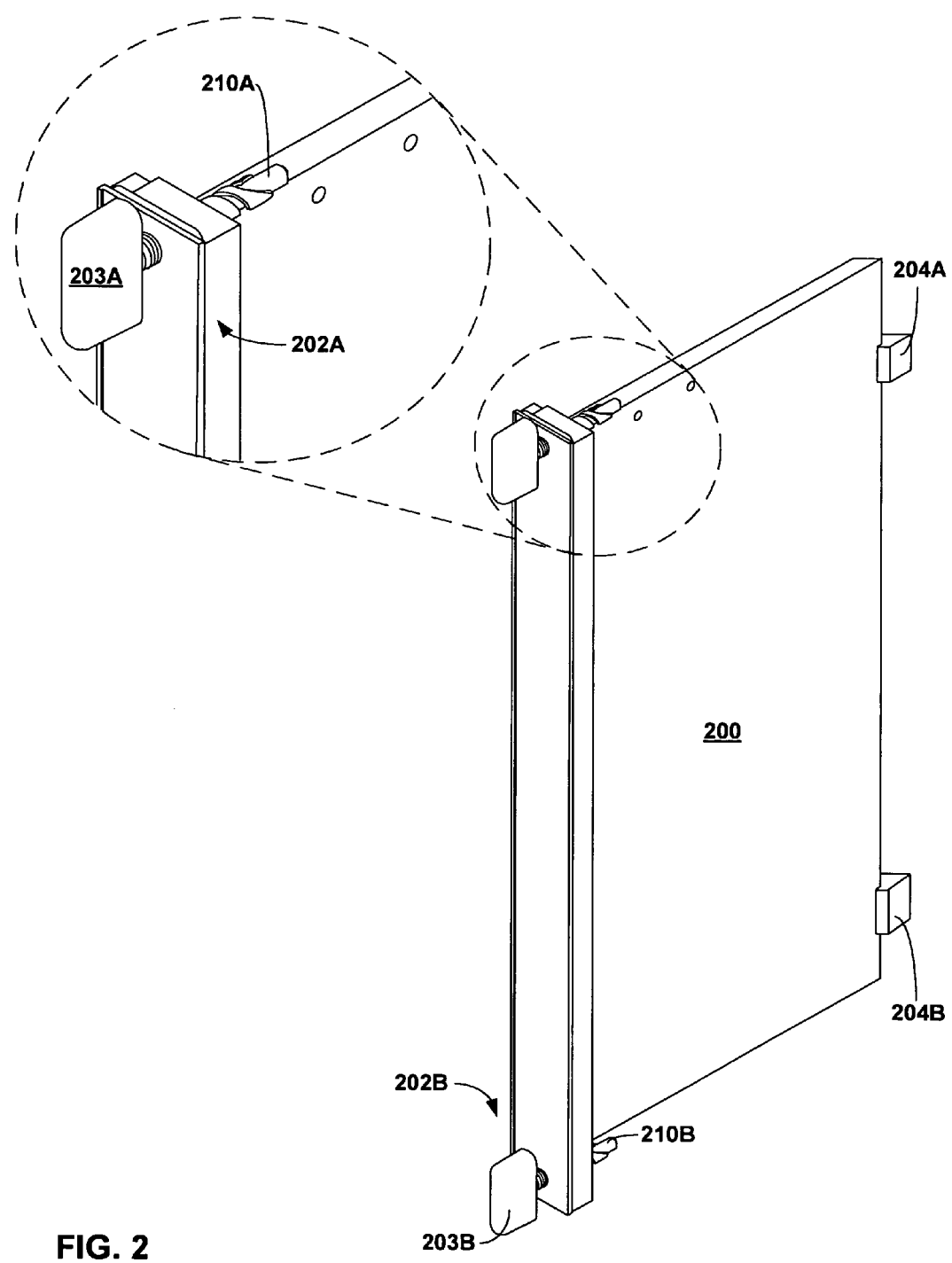
FIG. 2 is a perspective view illustrating a printed circuit board coupled to two insertion and extraction devices with positionable handles.

FIG. 2 illustrates printed circuit board 200 coupled to insertion and extraction devices 202A and 202B (collectively "insertion and extraction devices 202"). For example, insertion and extraction devices 202 may be substantially the same as insertion and extraction device 100 in FIG. 1. Printed circuit board 200 also includes connectors 204A and 204B (collectively "connectors 204") to electrically couple printed circuit board 200 to sockets on a system board (not shown).

To couple printed circuit board 200 to a system board, the distal ends of driveshafts 210A and 210B (collectively "driveshafts 210") are lined up with a receiving mechanism of the receptacle on the system board. For example, if driveshafts 210 include simple helical screw threads, the corresponding receiving mechanisms on the system board would be screw holes. Other coupling mechanisms are also possible, such as helical groove 113 and female connector 117 described with respect to driveshaft 110 in FIG. 1. Once driveshafts 210 are rotated, the interaction of driveshafts 210 with the receiving mechanisms cause printed circuit board 200 to be pulled toward the system board. Once printed circuit board 200 had been pulled far enough, connectors 204 will be fully inserted into sockets on the system board.

Insertion and extraction devices 202 include positionable handles 203A and 203B (collectively "handles 203"). Handles 203 allow an operator to rotate driveshafts 210 to insert or extract printed circuit board 200 from a system. The position of handles 203 may be selected by an operator by simply sliding handles 203 relative to the driveshafts 210. In this manner, an operator may select the position of handles 203 according to available space or to maximize torque applied to driveshafts 210.

Figure 3A:
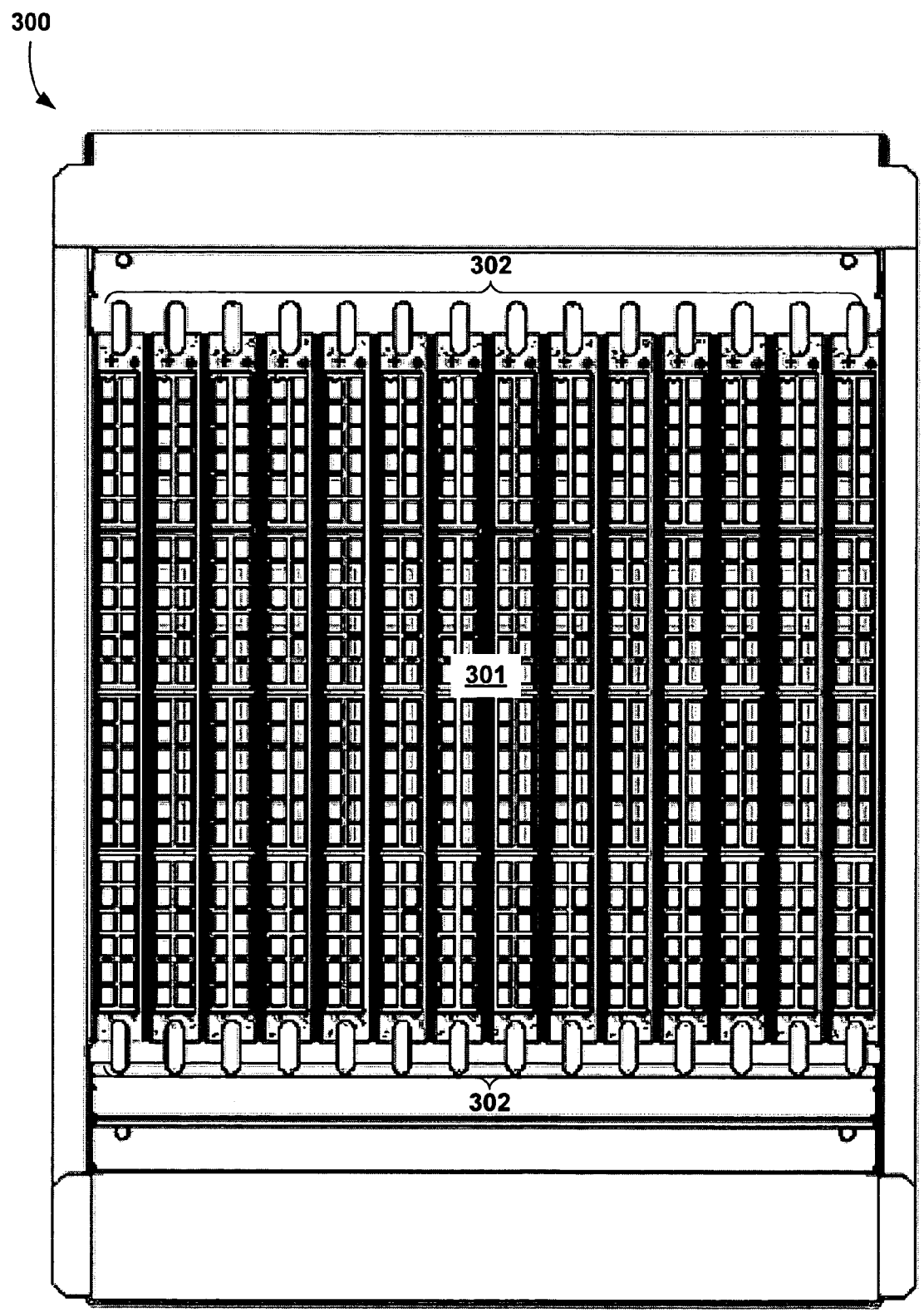
FIGS. 3A and 3B are conceptual diagrams illustrating a system including a plurality of printed circuit boards inserted into respective receptacles of a device with each printed circuit board including two insertion and extraction devices with positionable handles.
Figure 3B:
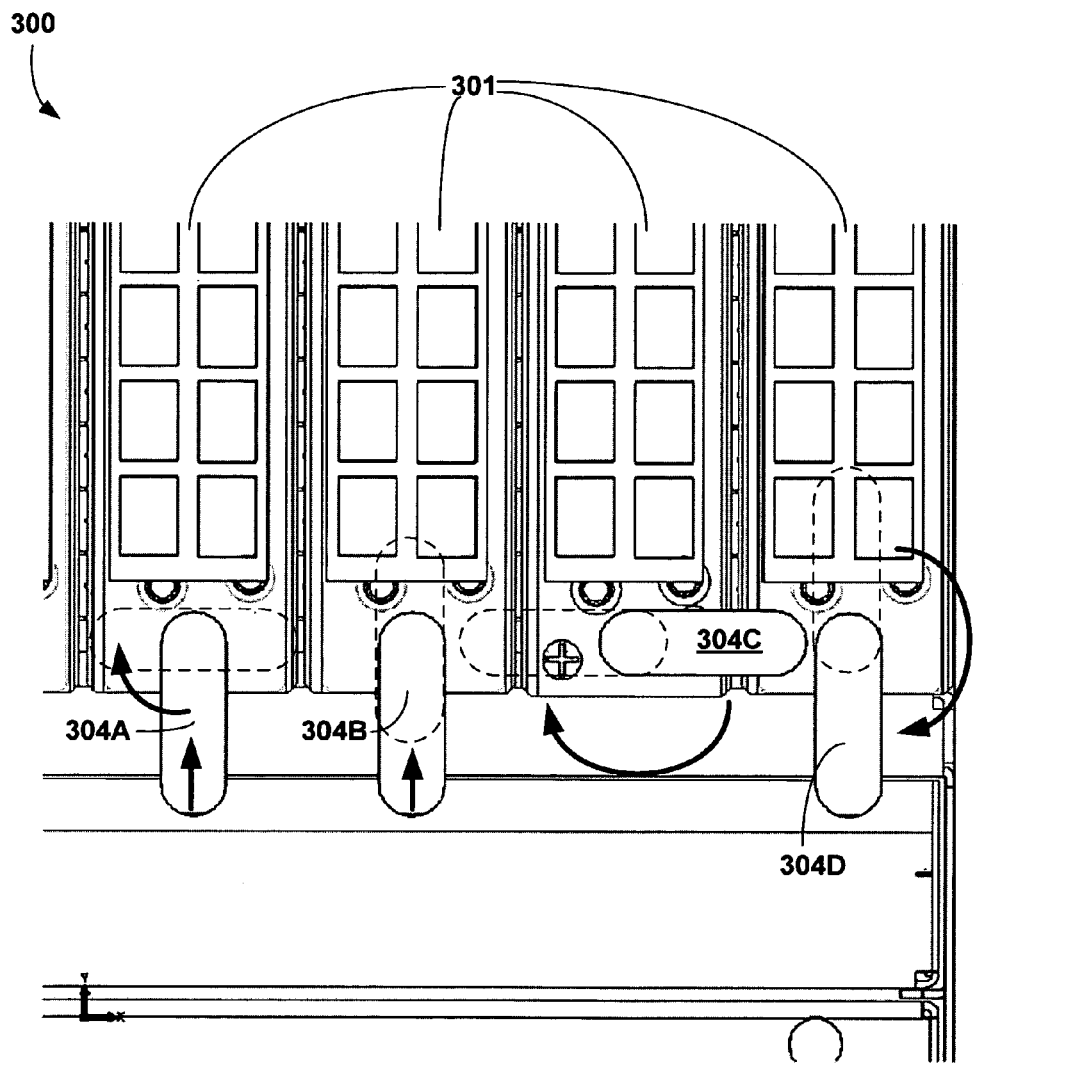

FIGS. 3A and 3B illustrate a plurality of printed circuit boards 301 mounted to system 300. Each of the plurality of printed circuit boards 301 includes a pair of insertion and extraction devices 302. Specifically, FIG. 3A illustrates a system 300 which includes receptacles into which printed circuit boards 301 are inserted or extracted and FIG. 3B illustrates a magnified portion of system 300. For example, receptacle of system 300 include a slot to sized to hold one of printed circuit boards 301 as well as receiving mechanisms to interact with insertion and extraction devices 302.

Printed circuited boards 301 are mounted in close proximity to each other within system 300. Accordingly, there is little room for an operator to rotate the handle of one of insertion and extraction devices 302 because the handle of another of insertion and extraction device 302, or another structural feature of system 300, may interfere with the rotational path of the handle.

However, as best shown in FIG. 3B, an operator can change the position of handles on insertion and extraction devices 302. FIG. 3B includes four insertion and extraction devices 302, each including one of handles 304A-304D. Handles 304A-304D are shown in various positions relative to driveshafts (not shown) of insertion and extraction devices 302. For example, handle 304A is shown in a vertical position, but may be rotated to a centered horizontal position without interfering with adjacent insertion and extraction devices 302. Likewise, handle 304B is shown in a vertical position and may be moved to a centered vertical position without interfering with adjacent insertion and extraction devices 302. Given the positions of handles 304B and 304D, handle 304C may be fully rotated without changing the position of handle 304C relative to the corresponding driveshaft. In contrast, handle 304D must be repositioned every half-turn to prevent handle 304C from interfering with the operation hand 304D. As shown by these examples, the selectable positions of handles 304A-304D provide an operator with the ability to maneuver insertion and extraction devices 200 within the limited space provided by the design of system 300.

Figure 4:
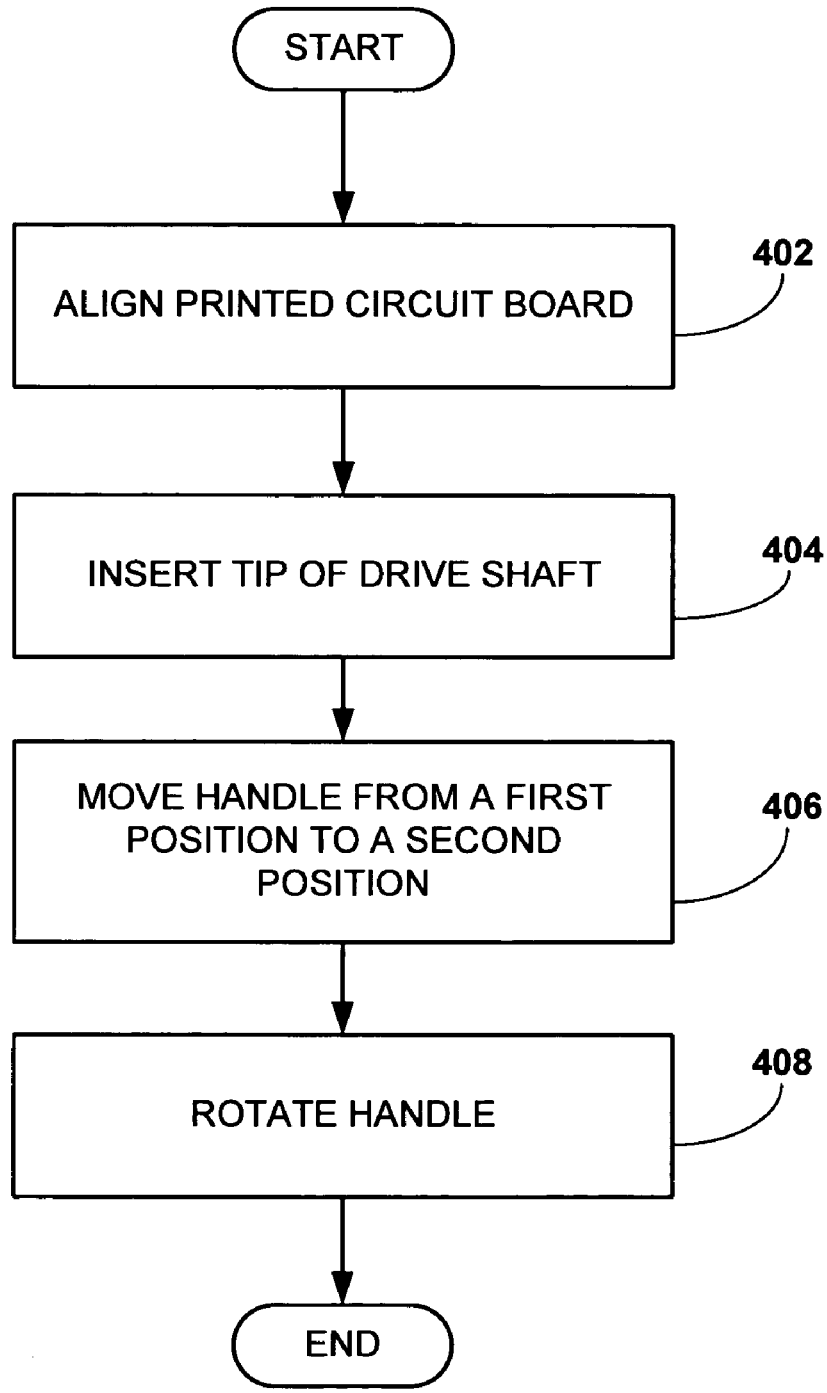
FIG. 4 is a flowchart illustrating an example method of using an insertion and extraction device with a positionable handle.

FIG. 4 is a flow chart illustrating the process of connecting a printed circuit board to a system board with insertion and extraction devices. The process of FIG. 4 is described with reference to the elements of FIG. 2. The process starts when an operator aligns printed circuit board 200 with a receptacle of a corresponding system board (402). Then, the operator inserts the tip of the each of driveshafts 203 into the receiving mechanism receptacle (404). If necessary or desired, the operator then moves the handle from a first position to a second position (406). For example, the operator may be required to adjust the position of the handle due to limited space around the handle. Next, the operator rotates handle 102 (408) turning driveshaft 110 and moving the printed circuit board assembly 200 towards the system board to couple connectors 204 to sockets of the system board. As part of step 408, if the available space requires, the operator may be required to change the position of handle 202 relative to driveshaft 210 one or more times. To remove printed circuit board 200 the operator reverses the process illustrated in FIG. 4.

Various embodiments of the invention have been described. Nevertheless, it will be understood that various modifications may be made without departing from the spirit and scope of the invention. For example, adjustable handles may include more or less than three detents or even no detents. As another example, detents for a handle could be implemented with features in a slider mechanism rather than in the handle; e.g., there could be grooves in the rod and a spring-loaded plunger in the driveshaft. Additionally, slider mechanisms other than the rod-though-driveshaft-hole design may be used to provide a selectable handle position.

These and other embodiments are within the scope of the following claims.

The invention claimed is:

1. A system comprising:
   a removable electrical component;
   a fixed receptacle to receive the removable electrical component; and
   an insertion and extraction device coupled to the removable electrical component, wherein the insertion and extraction device includes,
   a rotatable driveshaft that interacts with the receptacle when rotated for insertion and extraction of the removable electrical component,
   a handle comprising a rod coupled to a grip component that is sized to fit over a proximate end of the driveshaft, wherein the handle is coupled to the driveshaft such that, as the driveshaft rotates about its centerline, the handle also rotates about the centerline of the driveshaft, and
   a slider mechanism that allows the handle to slide along a line substantially perpendicular to the centerline of the driveshaft,
   wherein the proximate end of the driveshaft forms a hole and the rod of the handle fits within the hole to form the slider mechanism.

2. The system of claim 1, wherein the grip component forms a set of detents, wherein each detent is sized to firmly hold the proximate end of the driveshaft and an operator can select a position of the handle defined by one of the set of detents by sliding the handle until the driveshaft engages the detent.

3. The system of claim 1, wherein the rod forms a set of detents and the driveshaft includes a spring-loaded plunger within the hole sized to firmly hold one of the set of detents and an operator can select a position of the handle defined by one of the set of detents by sliding the handle until the spring-loaded plunger engages the detent.

4. The system of claim 1, wherein the grip component is a plastic component.

5. The system of claim 1, wherein a distal end of the driveshaft includes a helical groove that engages an assembly within the receptacle when rotated for insertion and extraction of the removable electrical component.

6. The system of claim 1, wherein the removable component is a printed circuit board.

7. The system of claim 1, wherein the system is a network device.

8. A device for inserting and extracting a removable electrical component, the device comprising:
- a rotatable driveshaft that interacts with a receptacle of a fixed component when rotated for insertion and extraction of the removable electrical component to and from the receptacle;
- a handle comprising a rod coupled to a grip component that is sized to fit over a proximate end of the driveshaft, wherein the handle is coupled to the driveshaft such that as the driveshaft rotates about its centerline, the handle also rotates about the centerline of the driveshaft; and
- a slider mechanism that allows the handle to slide along a line substantially perpendicular to the centerline of the driveshaft,
- wherein the proximate end of the driveshaft forms a hole and the rod of the handle fits within the hole to form the slider mechanism.

9. The device of claim 8, wherein the grip component forms a set of detents, wherein each detent is sized to firmly hold the proximate end of the driveshaft and an operator can select a position of the handle defined by one of the set of detents by sliding the handle until the driveshaft engages the detent.

10. The device of claim 8, wherein the rod forms a set of detents and the driveshaft includes a spring-loaded plunger within the hole sized to firmly hold one of the set of detents and an operator can select a position of the handle defined by one of the set of detents by sliding the handle until the spring-loaded plunger engages the detent.

11. The device of claim 8, wherein the grip component is a plastic component.

12. The device of claim 8, wherein the distal end of the driveshaft includes a helical groove that engages a female connector within the receptacle when rotated for insertion and extraction of the removable electrical component.

13. A method comprising:
- inserting a distal end of a driveshaft of an insertion and extraction device into a fixed receptacle of a system, wherein the insertion and extraction device is coupled to a removable electrical component;
- sliding a handle of the insertion and extraction device along a line that is substantially perpendicular to a centerline of the driveshaft to select a position of the handle, wherein the handle comprises a rod coupled to a grip component that is sized to fit over a proximate end of the driveshaft, the proximate end of the driveshaft forming a hole and the rod fitting within the hole to form a slider mechanism, wherein the handle is coupled to the driveshaft such that as the driveshaft rotates about its centerline, the handle also rotates about the centerline of the driveshaft, and wherein the sliding of the handle of the insertion and extraction device comprises sliding the rod through the hole; and rotating the handle and the driveshaft with the handle in the selected position to insert the removable component into the receptacle.

14. The method of claim 13, wherein the grip component forms a set of detents, each detent sized to firmly hold the proximate end of the driveshaft, and wherein sliding a handle to select a position comprises sliding the handle until the driveshaft engages one of the detents.

15. The method of claim 13, wherein a distal end of the driveshaft includes a helical groove that interacts with the receptacle for insertion or extraction during rotation of the handle and drive shaft.

16. The method of claim 13, wherein sliding the handle to select a position comprises sliding the handle from a first position to a second position, and rotating the handle and the driveshaft with the handle in the selected position comprises rotating the handle and the driveshaft with the handle in the second position, the method further comprising returning the handle to the first position after the removable component has been inserted into the receptacle.

17. The method of claim 13, further comprising rotating the handle and the driveshaft in an opposite direction to release the removable component from the system.

* * * * *